(12) United States Patent
Whittington et al.

(10) Patent No.: US 9,836,991 B2
(45) Date of Patent: Dec. 5, 2017

(54) VIRTUAL FLIGHT DECK

(75) Inventors: David H. Whittington, Renton, WA (US); Paul Thomas Snow, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 1495 days.

(21) Appl. No.: 12/249,359

(22) Filed: Oct. 10, 2008

(65) Prior Publication Data

US 2010/0094595 A1 Apr. 15, 2010

(51) Int. Cl.
*G09B 9/30* (2006.01)
*G09B 9/16* (2006.01)
*G01C 23/00* (2006.01)
*B60K 35/00* (2006.01)
*G06F 17/50* (2006.01)
*G09B 9/08* (2006.01)
*G01C 21/36* (2006.01)

(52) U.S. Cl.
CPC ............. *G09B 9/301* (2013.01); *G01C 23/00* (2013.01); *G09B 9/165* (2013.01); *B60K 35/00* (2013.01); *G01C 21/3664* (2013.01); *G01C 23/005* (2013.01); *G06F 17/5095* (2013.01); *G09B 9/08* (2013.01); *G09G 2380/12* (2013.01)

(58) Field of Classification Search
CPC .. G01C 23/00; G01C 23/005; G01C 21/3664; G09B 9/08; G09B 9/16; G09B 9/165; G09B 9/12; G09B 9/301; G06F 17/5095; B60K 35/00; G09G 2380/12
USPC .............. 434/29, 30, 40, 43, 44, 46, 38, 37; 340/973; 345/173; 701/3, 14
See application file for complete search history.

(56) References Cited

U.S. PATENT DOCUMENTS

| | | | |
|---|---|---|---|
| 4,373,169 A | 2/1983 | Burkam | |
| 5,320,538 A | 6/1994 | Baum | |
| 5,616,030 A | 4/1997 | Watson | |
| 5,999,185 A * | 12/1999 | Kato | G06F 3/011 345/420 |
| 6,634,885 B2 | 10/2003 | Hodgetts et al. | |
| 6,814,578 B2 | 11/2004 | Vorst | |
| 7,188,059 B2 | 3/2007 | White et al. | |
| 2002/0163498 A1* | 11/2002 | Chang | G06F 3/016 345/156 |
| 2004/0162648 A1* | 8/2004 | Bontrager et al. | 701/3 |
| 2007/0073526 A1* | 3/2007 | Maebayashi | G06Q 10/06 703/8 |
| 2007/0156540 A1* | 7/2007 | Koren | G06Q 10/087 705/14.51 |
| 2007/0236366 A1* | 10/2007 | Gur et al. | 340/945 |

\* cited by examiner

*Primary Examiner* — Jack Yip
(74) *Attorney, Agent, or Firm* — Yee & Associates, P.C.

(57) ABSTRACT

A method is present for presenting a flight deck. A model of the flight deck is identified having a number of locations for a number of displays. Aircraft data is obtained. A number of panels is generated from the aircraft data. A display of the flight deck is generated containing the number of panels in the number of locations to form a presentation of the flight deck.

15 Claims, 7 Drawing Sheets

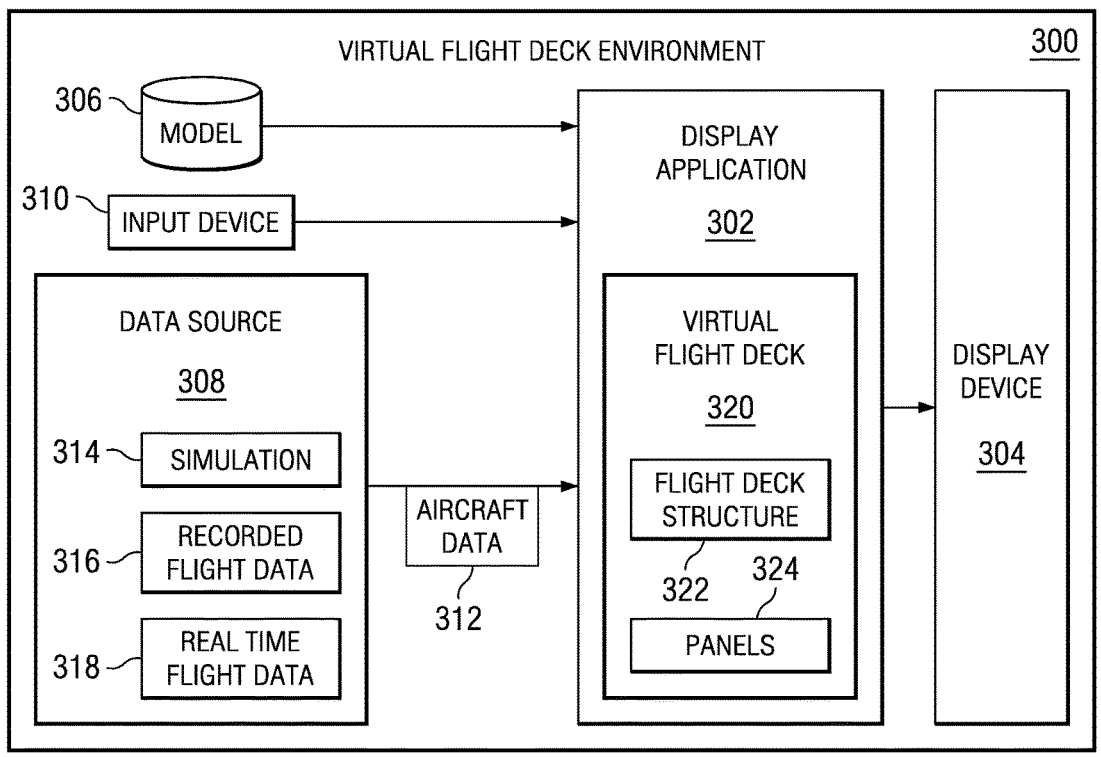
FIG. 3
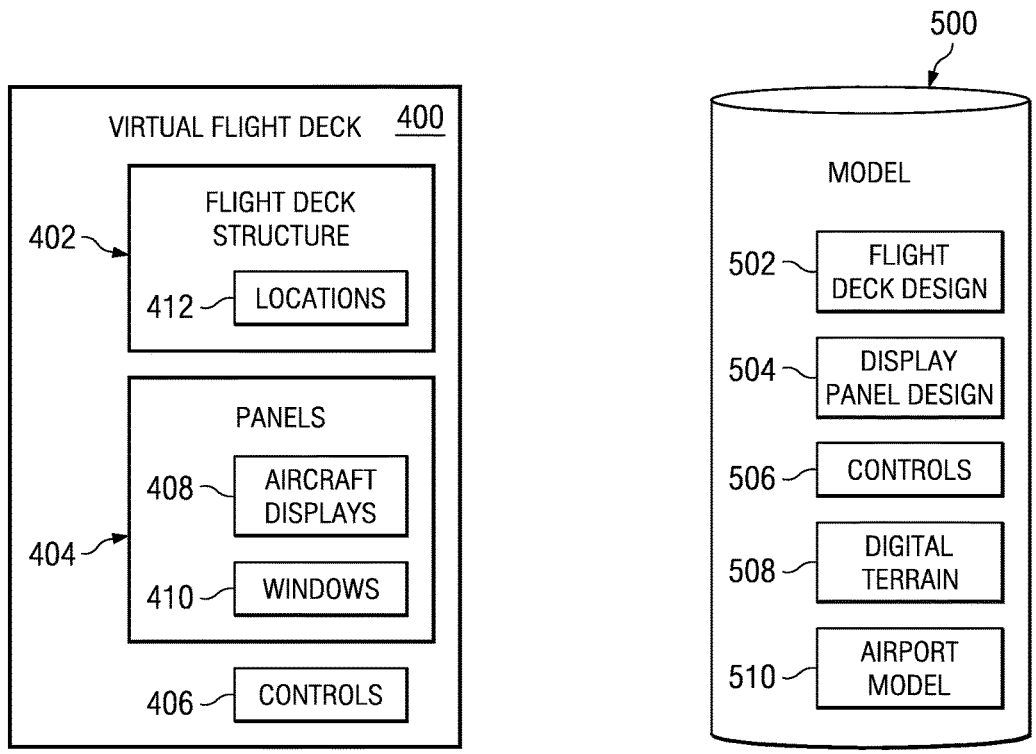
FIG. 4
FIG. 5

VIRTUAL FLIGHT DECK

BACKGROUND INFORMATION

1. Field

The present disclosure relates generally to an improved data processing system and, in particular, to a method and apparatus for simulating a flight deck. Still more particularly, the present disclosure relates to a computer implemented method, apparatus, and computer usable program code for simulating a flight deck from a model of the flight deck.

2. Background

A flight deck is an area in an aircraft from which a pilot and other crew members control the aircraft. A flight deck is typically near the front of the aircraft and may also be referred to as a cockpit. A flight deck contains flight instruments, controls, and windows through which pilots may view the external environment.

The flight instruments in a flight deck may include various instruments such as, for example, a mode control panel, a primary flight display, a navigation display, a flight management system and control unit, and other suitable instruments. Further, the controls operated by an aircraft may include a control column, a side stick, switches, and other controls. The configuration of different displays, windows, seats, and other components of a flight deck are complex.

When new designs are created for a flight deck, pilots, engineers, and other individuals may evaluate these designs before they are implemented into an aircraft or creating simulators. These simulators are a system that simulates the experience of an aircraft using a particular flight deck design. Flight simulators may be platforms that provide an environment to train pilots prior to those pilots flying an actual aircraft with the same type of flight deck.

Currently, initial evaluations of flight deck designs involve viewing a prototype. These prototypes are typically built out of plywood and/or foam core. These prototypes may be expensive and may be time-consuming to build. As a result, the evaluation of flight deck designs may be limited or slowed down by the cost and time needed to create prototypes for review.

Therefore, it would be advantageous to have a method, apparatus, and computer program code to simulate a flight deck in a manner that overcomes the problems described above.

SUMMARY

In one advantageous embodiment, a method is present for presenting a flight deck. A model of the flight deck is identified having a number of locations for a number of displays. Aircraft data is obtained. A number of panels are generated from the aircraft data. A display of the flight deck is generated containing the number of panels in the number of locations to form a presentation of the flight deck.

In another advantageous embodiment, a data processing system comprises a bus, a communications unit connected to the bus, a storage device connected to the bus, and a processor unit connected to the bus. The storage device includes program code. The processor unit executes the program code to identify a model of a flight deck having a number of locations for a number of displays. The processor unit obtains aircraft data and generates a number of panels from the aircraft data. The processor unit generates a display of the flight deck containing the number of panels in the number of locations to form a presentation of the flight deck.

In yet another advantageous embodiment, a computer program product for presenting a flight deck comprises a computer recordable storage medium and program code stored on the computer recordable storage medium. Program code is present for identifying a model of the flight deck having a number of locations for a number of displays. Program code is present for obtaining aircraft data and generating a number of panels from the aircraft data. Program code is also present for generating a display of the flight deck containing the number of panels in the number of locations to form a presentation of the flight deck.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

FIG. 3 is a diagram of a virtual flight deck environment in accordance with an advantageous embodiment;

FIG. 4 is a diagram illustrating a virtual flight deck in accordance with an advantageous embodiment;

FIG. 5 is a diagram illustrating an example of a model in accordance with an advantageous embodiment;

DETAILED DESCRIPTION

Figure 1:
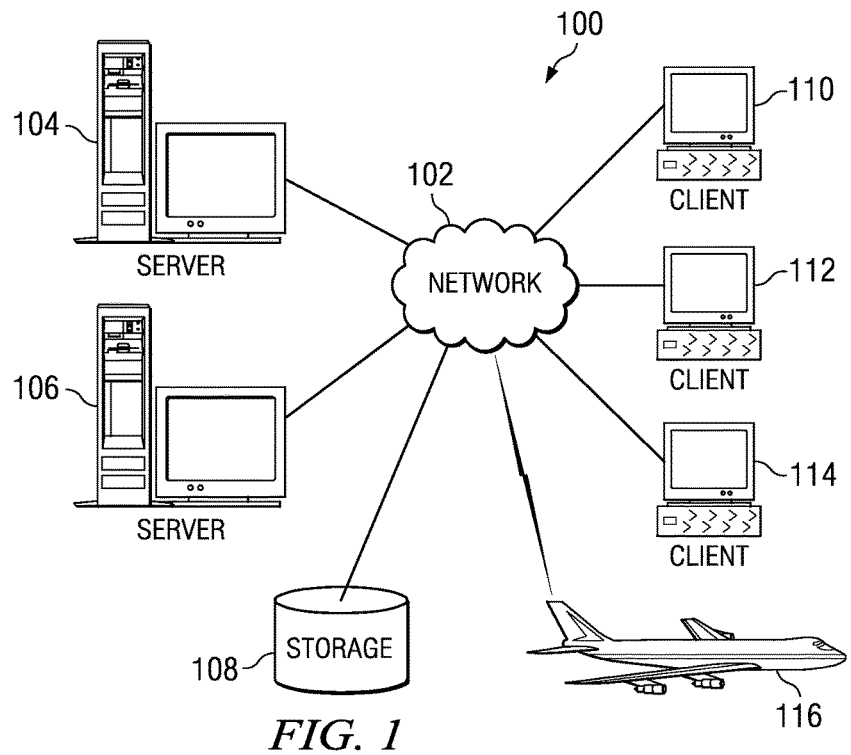
FIG. 1 is a diagram of a data processing environment in which the advantageous embodiments of the present invention may be implemented.
Figure 2:
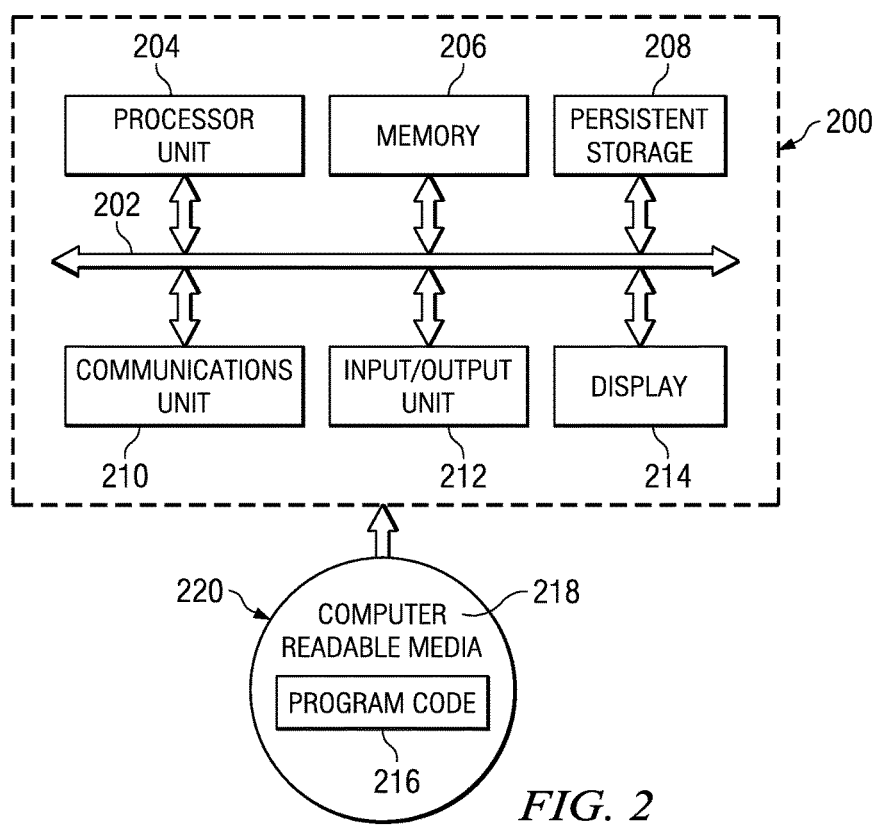
FIG. 2 is a diagram of a data processing system in accordance with an illustrative embodiment.

With reference now to the figures and, in particular, with reference to FIGS. 1-2, exemplary diagrams of data processing environments are provided in which the advantageous embodiments of the present invention may be implemented. It should be appreciated that FIGS. 1-2 are only exemplary and are not intended to assert or imply any limitation with regard to the environments in which different embodiments may be implemented. Many modifications to the depicted environments may be made.

With reference now to FIG. 1, a pictorial representation of a network of data processing systems is depicted in which the advantageous embodiments of the present invention may be implemented. Network data processing system 100 is a network of computers in which embodiments may be implemented. Network data processing system 100 contains network 102, which is the medium used to provide communications links between various devices and computers connected together within network data processing system 100. Network 102 may include connections such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data such as boot files, operating system images, and applications to clients 110, 112, and 114. Clients 110, 112, and 114 are clients to server 104 in this example. Aircraft 116 also is a client that may exchange information with clients 110, 112, and 114. Aircraft 116 also may exchange information with servers 104 and 106. Aircraft 116 may exchange data with different computers through a wireless communications link while in-flight or any other type of communications link while on the ground.

In these examples, server 104, server 106, client 110, client 112, and client 114 may be computers. In different advantageous embodiments, various computers within network data processing system 100 may be used to provide a presentation of a virtual flight deck. For example, server 104 may execute processes to generate a virtual flight deck. In other advantageous embodiments, client 112 may execute processes to generate a virtual flight deck. In yet other advantageous embodiments, multiple computers or data processing systems within network data processing system 100 may be used to generate the virtual flight deck presentation. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. Of course, network data processing system 100 also may be implemented as a number of different types of networks such as, for example, an intranet, a local area network (LAN), or a wide area network (WAN). FIG. 1 is intended as an example and not as an architectural limitation for different embodiments.

Turning now to FIG. 2, a diagram of a data processing system is depicted in accordance with an illustrative embodiment. Data processing system 200 is an example of a data processing system that may be used to implement servers and clients, such as server 104 and client 110 in FIG. 1. Further, data processing system 200 is an example of a data processing system that may be found in aircraft 116 in FIG. 1.

In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer usable program code, or computer readable program code that may be read and executed by a processor in processor unit 204. The program code in the different embodiments may be embodied on different physical or tangible computer readable media, such as memory 206 or persistent storage 208.

Program code 216 is located in a functional form on computer readable media 218 and may be loaded onto or transferred to data processing system 200 for execution by processor unit 204. Program code 216 and computer readable media 218 form computer program product 220 in these examples. In one example, computer readable media 218 may be in a tangible form such as, for example, an optical or magnetic disc that is inserted or placed into a drive or other device that is part of persistent storage 208 for transfer onto a storage device, such as a hard drive that is part of persistent storage 208.

In a tangible form, computer readable media 218 also may take the form of a persistent storage, such as a hard drive or a flash memory, that is connected to data processing system 200. The tangible form of computer readable media 218 is also referred to as computer recordable storage media.

Alternatively, program code 216 may be transferred to data processing system 200 from computer readable media 218 through a communications link to communications unit 210 and/or through a connection to input/output unit 212. The communications link and/or the connection may be physical or wireless in the illustrative examples. The computer readable media also may take the form of non-tangible media, such as communications links or wireless transmissions, containing the program code.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200.

Other components shown in FIG. 2 can be varied from the illustrative examples shown. The different embodiments may be implemented using any hardware device or system capable of executing program code. As one example, the data processing system may include organic components integrated with inorganic components and/or may be comprised entirely of organic components excluding a human being. For example, a storage device may be comprised of an organic semiconductor.

As another example, a storage device in data processing system 200 is any hardware apparatus that may store data. Memory 206, persistent storage 208, and computer readable media 218 are examples of storage devices in a tangible form. In yet another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system.

Additionally, a communications unit may include one or more devices used to transmit and receive data, such as a modem or a network adapter. Further, a memory may be, for example, memory 206 or a cache such as found in an interface and memory controller hub that may be present in communications fabric 202.

The different advantageous embodiments recognize that currently, flight deck concepts may be custom built and disposed of after they are no longer needed. The different advantageous embodiments recognize that a number of different solutions may be used to avoid the expenses of building flight deck designs and creating programs for simulations. For example, training for flight crews may be performed using paper exercises with limited training software. Currently, the different advantageous embodiments recognize that non-functioning mockups and graphics may be used to demonstrate new features to prospective new customers.

The different advantageous embodiments recognize that evaluating new flight deck designs may be difficult to perform without a physical model. Physical models, however, take time and expense to create. Further, the different advantageous embodiments also recognize that training crews in the layouts and functions of new aircraft flight decks typically require expensive simulators.

The different advantageous embodiments also recognize that cheaper simulators may be used. The advantageous embodiments recognize, however, that these designs may not provide the realism needed for proper training. Further, the creation of software simulations are usually available late in aircraft production and testing processes. This type of ability also may cause delays in training flight crew.

Also, the different advantageous embodiments recognize that new flight deck features may be hard to demonstrate to prospective customers with currently available physical mockups. These types of designs do not provide a capability to convey a feel for how the systems look and work.

Thus, the different advantageous embodiments provide a method, apparatus, and computer program code for presenting a flight deck. In one advantageous embodiment, a model of the flight deck having a plurality of panels in which each panel has a location within the flight deck is identified. Aircraft data is obtained. A display for each of the plurality of panels is generated to form a plurality of displays. The flight deck is then presented. The plurality of displays is displayed within the plurality of locations for the plurality of flight panels within the presentation of the flight deck.

In other advantageous embodiments, a number of controls may be displayed within the flight deck being presented in which the number of controls is capable of being manipulated by user input applied to the number of controls. As used herein, a number of items refers to one or more items. For example, a number of controls is one or more controls. New aircraft data may be generated from the user input. The plurality of flight displays may be modified based on the new aircraft data. This modification may be for a number of the plurality of displays.

With reference now to FIG. 3, a diagram of a virtual flight deck environment is depicted in accordance with an advantageous embodiment. In this example, virtual flight deck environment 300 may be implemented using one or more data processing systems such as, for example, data processing system 200 in FIG. 2. Virtual flight deck environment 300 includes display application 302, display device 304, model 306, data source 308, and input device 310.

Model 306 is a model of a flight deck. Model 306 may take various forms. For example, without limitation, model 306 may be a computer aided design model. The computer aided design model may be created using a variety of different types of computer aided design programs. For example, without limitation, computer aided design three-dimensional interactive application (CATIA) V5 is an example of a computer aided design application that may be used to create a three-dimensional model of a flight deck for use to implement model 306. CATIA V5 is available from Dassault Systemes. Of course, any type of computer aided design program for creating a three-dimensional model of a flight deck may be used for model 306 in these examples.

Data source 308 is a source of aircraft data 312. Aircraft data 312 provides information about an aircraft during different phases of flight. This information may include, for example, without limitation, speed, total pressure, dynamic pressure, attitude, and other suitable aircraft data. Data source 308 may have various sources for aircraft data 312. These sources may include, for example, simulation 314, recorded flight data 316, real time flight data 318, and other suitable sources of aircraft data 312.

Display application 302 uses model 306 and data source 308 to generate virtual flight deck 320. In this example, virtual flight deck 320 includes flight deck structure 322 and panels 324. Flight deck structure 322 is a view of the physical components in the flight deck. Display application 302 combines aircraft data 312 from data source 308 with model 306 to generate virtual flight deck 320 for presentation on display device 304. With the use of aircraft data 312, display application 302 may generate realistic displays for panels 324.

Panels 324 are displays that may be generated from aircraft data 312. These panels include, for example, without limitation, instrument displays and/or other aircraft displays within flight deck structure 322. Flight deck structure 322 has a number of locations for panels 324. These locations may be defined in model 306. The particular panels may be associated with the locations defined in model 306 through user input, files, or other information.

In some implementations, model 306 may identify particular panels within panels 324 for locations in flight deck structure 322. These panels may be for displays such as a primary flight display, a navigation display, a flight management and control unit display, and other suitable instrument displays within the flight deck. Further, panels 324 may also include displays for windows within the cockpit. The panels may change as the simulation of the aircraft changes with respect to the aircraft's location, orientation, state information, and other information about the aircraft changes. The panel changes may be initiated through user input to data source 308.

The illustration of virtual flight deck environment 300 in FIG. 3 is not meant to imply physical or architectural limitations to the manner in which virtual flight deck environment 300 may be implemented. In some embodiments, other components may be used in addition to and/or in place of the ones illustrated. For example, in some advantageous embodiments, display application 302 may be a number of different programs operating to generate virtual flight deck 320. In other advantageous embodiments, multiple modules, programs, or other software components may be present to form display application 302 to generate virtual flight deck 320.

In yet other advantageous embodiments, additional models in addition to model 306 may be present for other flight deck designs. Further, the different components illustrated may be located on a single data processing system or distributed across multiple data processing systems. For example, display application 302 may be located on one computer, while model 306 may be located on another computer. Also, display device 304 may take a number of different forms.

For example, display device 304 may be a liquid crystal display, an organic light emitting diode display, a projection device, a three-dimensional display, or some other suitable display device. Display device 304 may be selected to have a high enough resolution to provide a realistic presentation of the flight deck. For example, the display device may generate a display that is 1920×1080 in pixels or greater. Of course, the greatest resolution possible is desired to provide the most realistic views. As yet another example, aircraft data also may be stored in a spreadsheet or other suitable format.

With reference now to FIG. 4, a diagram illustrating a virtual flight deck is depicted in accordance with an advantageous embodiment. Virtual flight deck 400 is an example of one implementation of virtual flight deck 320 that may be generated using display application 302 in FIG. 3. Virtual flight deck 400 may be generated in a form to provide high amounts of detail. This amount of detail may be limited only by the capability of the video generation system and/or display device used to present virtual flight deck 400. Virtual flight deck 400 includes flight deck structure 402, panels 404, and controls 406.

Flight deck structure 402 is a presentation of the physical components within the virtual flight deck. These components may include, for example, without limitation, a floor, a ceiling, walls, chairs, or other suitable components.

Panels 404 are displays simulating information that may be generated from aircraft data. The locations of panels 404 in flight deck structure 402 may be identified by a model of the flight deck, user input, or some other suitable source of information. In these examples, panels 404 may present dynamic information in response to changing aircraft data. This dynamic presentation of information within panels 404 may increase the realism of virtual flight deck 400. Panels 404 may include, for example, aircraft displays 408, windows 410, and/or some other suitable display.

Aircraft displays 408 are examples of different displays that may be presented within the flight deck. These displays include, for example, without limitation, a primary flight display, a multi-function display, a navigation display, a heads up display, and other suitable displays. Windows 410 provide a display of what an operator would see from windows located within virtual flight deck 400 during operation of the aircraft.

In some advantageous embodiments, a panel within panels 404 may overlap another panel. For example, one panel in panels 404 may provide a display of the environment outside of the flight deck, while another panel within panels 404 may provide a heads up display, which is seen overlaid on the view seen outside of the aircraft.

Panels 404 may be presented within locations 412 in flight deck structure 402. Locations 412 in flight deck structure 402 may be defined with respect to space and orientation. Particular panels of panels 404, however, may need to be assigned to locations 412. The association of locations 412 with panels 404 may be designated by a user input, a file, information from a model of the virtual flight deck, and/or other suitable sources. When virtual flight deck 400 is presented, panels 404 are displayed within locations 412 in flight deck structure 402 in a manner that provides a realistic view of what a pilot or other operator would see within the flight deck modeled by virtual flight deck 400.

Controls 406 also may be presented within various locations within locations 412. Controls 406 may be manipulated through user input. Controls 406 provide a capability to provide user input to change the display within panels 404. For example, controls 406 may include a flight column, a control stick, a switch, a knob, and/or other controls which a user may operate through various user inputs to change the operation of the aircraft.

In another example, if a user changes the orientation or attitude of an aircraft, panels 404 may change to reflect this change in position orientation. For example, a panel presenting a display of the environment outside of virtual flight deck 400 may change the view that is seen by the user. A panel showing altitude or attitude information also may change to show the change made in response to the user input.

The user input may take various forms including a gesture recognition device, a mouse, a joystick, an eye pointing device, or some other suitable user input device. A gesture recognition device may interpret human gestures such as hand movements to generate user input. An eye pointing device may measure movement of the user's eyeballs to generate user input. This user input may be used to generate changes if a simulation is a source of aircraft data.

The illustration of virtual flight deck 400 in FIG. 4 is not meant to imply physical or architectural limitations to the manner in which different virtual flight decks may be implemented. Depending on the particular implementation, some virtual flight decks may include other components in addition to or in place of the ones illustrated. For example, in some advantageous embodiments, controls 406 may be considered a type of panel within panels 404. In yet other advantageous embodiments, only a single window may be present within windows 410, or no windows may be present.

With reference now to FIG. 5, a diagram illustrating an example of a model is depicted in accordance with an advantageous embodiment. Model 500 is an example of one manner in which model 306 in FIG. 3 may be implemented. Model 500 may include flight deck design 502, display panel design 504, and controls 506. Flight deck design 502 may be a computer aided design model of the structure of the flight deck. Display panel design 504 may contain information about the displays that are present within the flight deck. For example, display panel design 504 may identify a panel as being a navigation display and provide information such as, for example, size, location, orientation, and other suitable information about the display.

Controls 506 may define interactive controls on the control panel. These interactive controls may be used by the different advantageous embodiments to provide the capability for users to generate input into the virtual flight deck.

In some advantageous embodiments, model 500 also may include digital terrain 508 and airport model 510. Digital terrain 508 and airport model 510 may be used to generate panels for use in presenting displays that may be seen outside the window of a flight deck.

The illustration of model 500 in FIG. 5 is not meant to imply architectural limitations to the manner in which model 500 may be implemented. In other advantageous embodiments, model 500 may include other information in addition to the different components illustrated for model 500. For example, model 500 also may include a computer aided design model or other information used to generate a display of a pilot or other flight crew member. In other advantageous embodiments, airport model 510 may be unnecessary.

Figure 6:
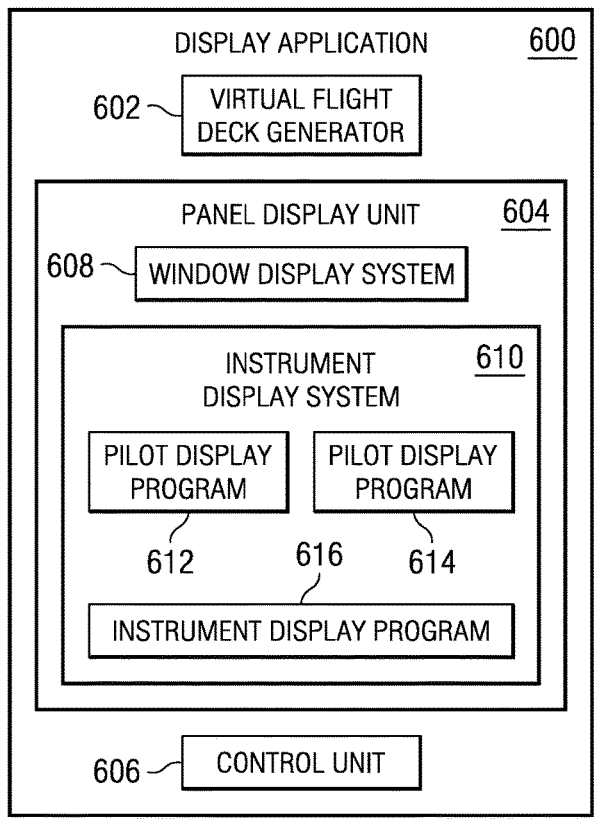
FIG. 6 is a diagram illustrating a display application in accordance with an advantageous embodiment.

With reference now to FIG. 6, a diagram illustrating a display application is depicted in accordance with an advantageous embodiment. Display application 600 is an example of one implementation of display application 302 in FIG. 3. In this example, display application 600 includes virtual flight deck generator 602, panel display unit 604, and control unit 606.

Panel display unit 604 may generate the various displays for panels. These displays include those for windows and instruments located within the virtual flight deck. Panel display unit 604 may generate panels for windows and instrument displays within the virtual flight deck. In this illustrative example, panel display unit 604 may include window display system 608 and instrument display system 610. Each of these systems may contain one or more programs for generating displays for panels.

In this illustrative example, window display system 608 generates panels that simulate the display of views from one or more windows in the flight deck. These panels may be generated from aircraft data as well as image or computer aided design (CAD) data describing terrain, airports, and other suitable objects that may be seen from a flight deck.

Instrument display system 610 includes pilot display program 612, pilot display program 614, and instrument display program 616. In this example, pilot display program 612 and pilot display program 614 each generate a display for one panel in the flight deck. A panel for an instrument display within the flight deck corresponds to a particular display such as, for example, a multi-function display, a primary flight display, a navigation display, or some other suitable display of instruments or data within the flight deck. Instrument display program 616 generates a display for instruments within the flight deck. Of course, depending on the particular implementation, a separate display program may be present for each instrument or display within the flight deck.

In some advantageous embodiments, pilot display program 612 and pilot display program 614 may be programs that generate video data. In other advantageous embodiments, these pilot display programs may take the form of files such as, for example, a slideshow file, a webpage, or other suitable image.

In this manner, the different advantageous embodiments provide a capability to quickly change the view of different flight deck designs without coding and/or mockups. The panels used in one presentation of a flight deck may be used with another flight deck by switching the model and identifying locations for the panels in the new flight deck. For example, a panel for navigation display in one flight deck may be used in another flight deck presentation. No new code is needed. The panel may be resized, changed in location, and/or changed in orientation within the new flight deck. The process to create the navigation display does not need to be recoded.

The illustration of display application 600 is not meant to imply architectural limitations to the manner in which display applications may be implemented. In other advantageous embodiments, display application 600 may include other components in addition to or in place of the ones illustrated. For example, in some advantageous embodiments, only a single pilot display program may be present. In yet other advantageous embodiments, multiple instrument display programs may be present. Further, other types of display programs also may be generated depending on the particular implementation. For example, in some advantageous embodiments, a display program may be present to simulate or generate a pilot within the flight deck.

Figure 7:
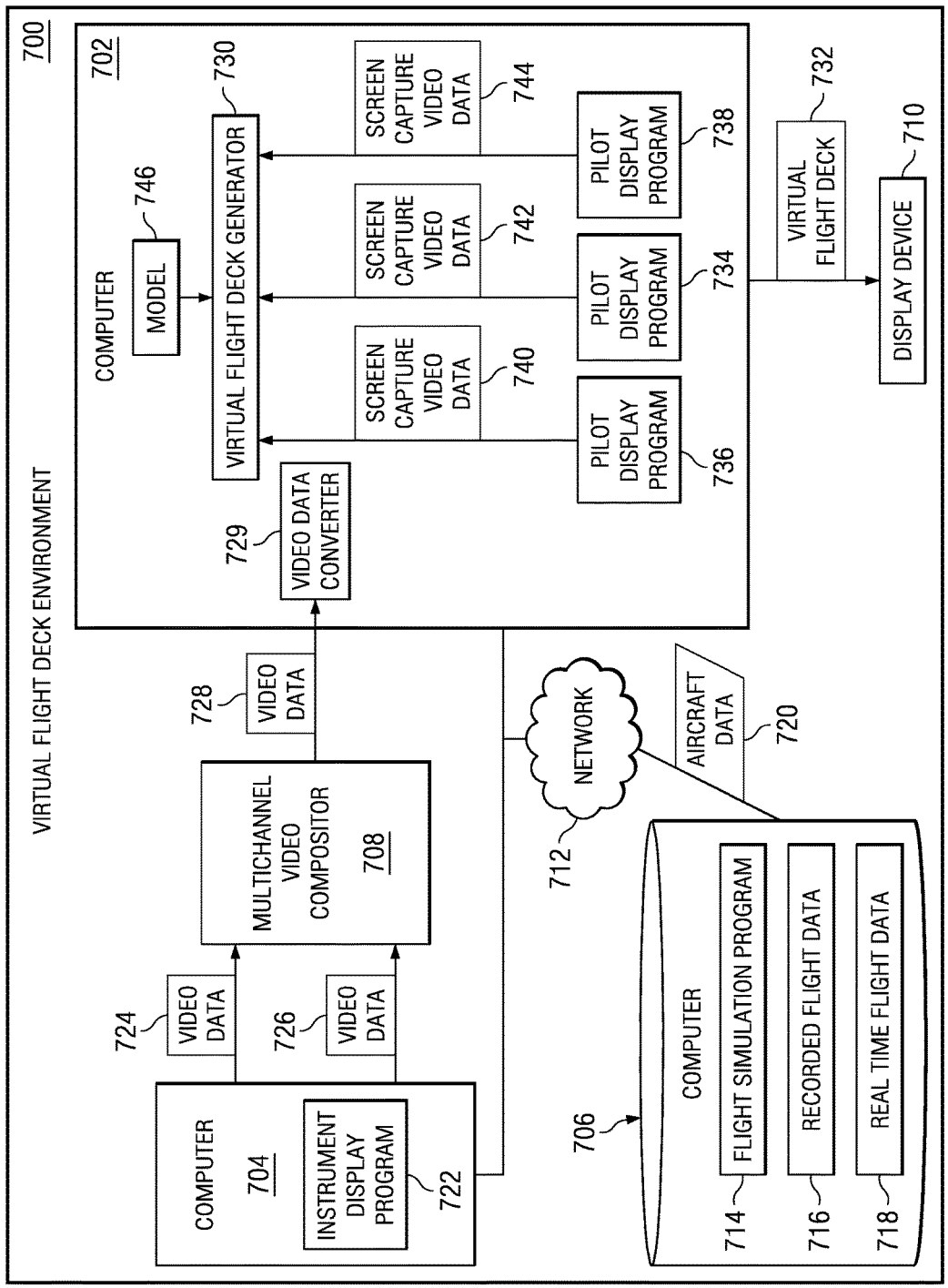
FIG. 7 is a diagram of a virtual flight deck environment in accordance with an advantageous embodiment.

With reference now to FIG. 7, a diagram of a virtual flight deck environment is depicted in accordance with an advantageous embodiment. Virtual flight deck environment 700 is an example of one manner in which virtual flight deck environment 300 in FIG. 3 may be implemented.

In this illustrative example, virtual flight deck environment 700 includes computer 702, computer 704, and computer 706. Further, virtual flight deck environment 700 also includes multichannel video compositor 708 and display device 710. Network 712 in virtual flight deck environment 700 provides communications between computers 702, 704, and 706.

In these examples, computer 706 is a source of aircraft data. These sources may include, for example, without limitation, flight simulation program 714, recorded flight data 716, and real time flight data 718.

When computer 706 executes flight simulation program 714, flight simulation program 714 generates aircraft data 720, which is sent over network 712 to computers 704 and 702. Aircraft data 720 may include, for example, without limitation, aircraft position, orientation, state data, and/or other information that may be used to generate panels for display. In these examples, state data may include, for example, airspeed, altitude, pitch, bank, heading, autopilot mode, descent rate, engine revolutions per minute, engine temperature, estimated time of arrival at a way point, and/or other suitable data.

Further, computer 706 may contain recorded flight data 716. Recorded flight data 716 may be sent as aircraft data 720. When real time flight data 718 is used, computer 706 may be a computer receiving real time flight data 718 from an aircraft or may be a computer within an aircraft generating real time flight data 718 to form aircraft data 720.

In this example, computer 704 receives aircraft data 720 for use by instrument display program 722. Instrument display program 722 may generate video data 724 and video data 726 using aircraft data 720. These streams of video data are sent to multichannel video compositor 708. This component puts the separate video streams for the different displays into a single video stream in the form of video data 728.

Video data 728 is sent to computer 702 and received by video data converter 729 for use by virtual flight deck generator 730 to generate virtual flight deck 732 for presentation on display device 710. A Matrox VIO frame grabber card, which is available from Matrox Electronic Systems, LTD, is one example of video data converter 729 that may be used in computer 702.

Pilot display program 734, pilot display program 736, and pilot display program 738 execute on computer 702 to generate screens that may be captured. These components generate screen capture video data 740, 742, and 744 for use by virtual flight deck generator 730. Instrument display program 722, pilot display program 734, pilot display program 736, and pilot display program 738 may generate video and/or images for use in panels for use in virtual flight deck 732. In some advantageous embodiments, some of these programs may take the form of a file with slides, images, or video. In other advantageous embodiments, one or more of these programs may generate video and/or images from aircraft data 720.

Thus, the different advantageous embodiments may use various video data techniques, such as video frame grabbing, screen capture, or other suitable techniques to create displays for panels in virtual flight deck 732. Graphics filters or shaders may be used in manipulating these displays for use. These techniques and other suitable techniques allow for adding displays to virtual flight deck 732 from many sources. For example, the displays may be from existing displays developed for other simulations. These displays may be resized, reoriented, and manipulated in other suitable ways for use in virtual flight deck 732.

Further, virtual flight deck generator 730 also receives model 746. In this example, model 746 represents three-dimensional model inputs. The model may be a model of the aircraft as well as terrain that may be presented. Virtual flight deck generator 730 converts screen capture video data 740, 742 and 744 into textures that may be used to create dynamic pilot displays for presentation on the panels for virtual flight deck 732. Further, video data 728 may be processed to identify instrument displays for presentation within panels for virtual flight deck 732.

Virtual flight deck 732 may be presented on display device 710. In these examples, computer 702 may have a three-dimensional video card connected to display device 710. A Nvidia GeForce 8800 Ultra is an example of a three-dimensional video card that may be used. This video card is available from Nvidia Corporation. Display device 710 may take various forms. For example, display device 710 may be a high-definition projector or a liquid crystal display panel.

By generating virtual flight deck 732 using model 746 and aircraft data 720, new designs for flight decks may be quickly examined, tested, and/or reviewed with much less time and expense as compared to currently used systems. A new design may be reviewed by changing model 746 to a model for another new design.

Figure 8:
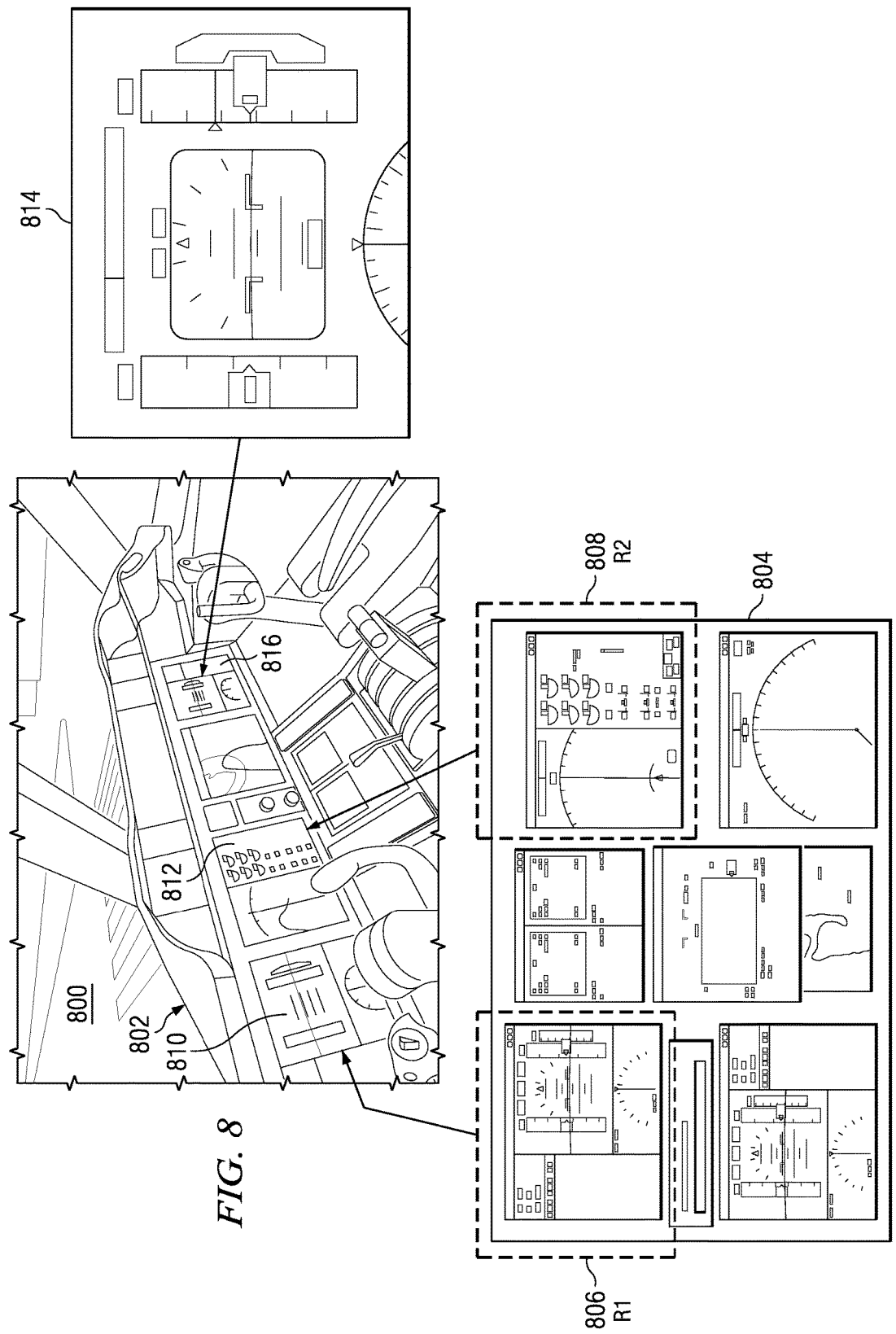
FIG. 8 is a diagram illustrating assignment of panels in a virtual flight deck in accordance with an advantageous embodiment.

With reference now to FIG. 8, a diagram illustrating assignment of panels in a virtual flight deck is depicted in accordance with an advantageous embodiment. In this example, virtual flight deck 800 contains panels 802 for instrument displays. These panels may be filled from displays generated by the display application according to an advantageous embodiment. For example, display 804 contains a number of different displays.

Section 806 and section 808 in display 804 may be mapped to location 810 and location 812 in virtual flight deck 800. Each of these sections is a panel that may be displayed in a location within virtual flight deck 400 in FIG. 4. As another example, display 814 is a panel generated from screen capture video data. Display 814 may be displayed in location 816 in virtual flight deck 800. In the different advantageous embodiments, any window or pixel region may be assigned to a particular location, orientation, and/or scale during presentation of virtual flight deck 800.

Figure 9:
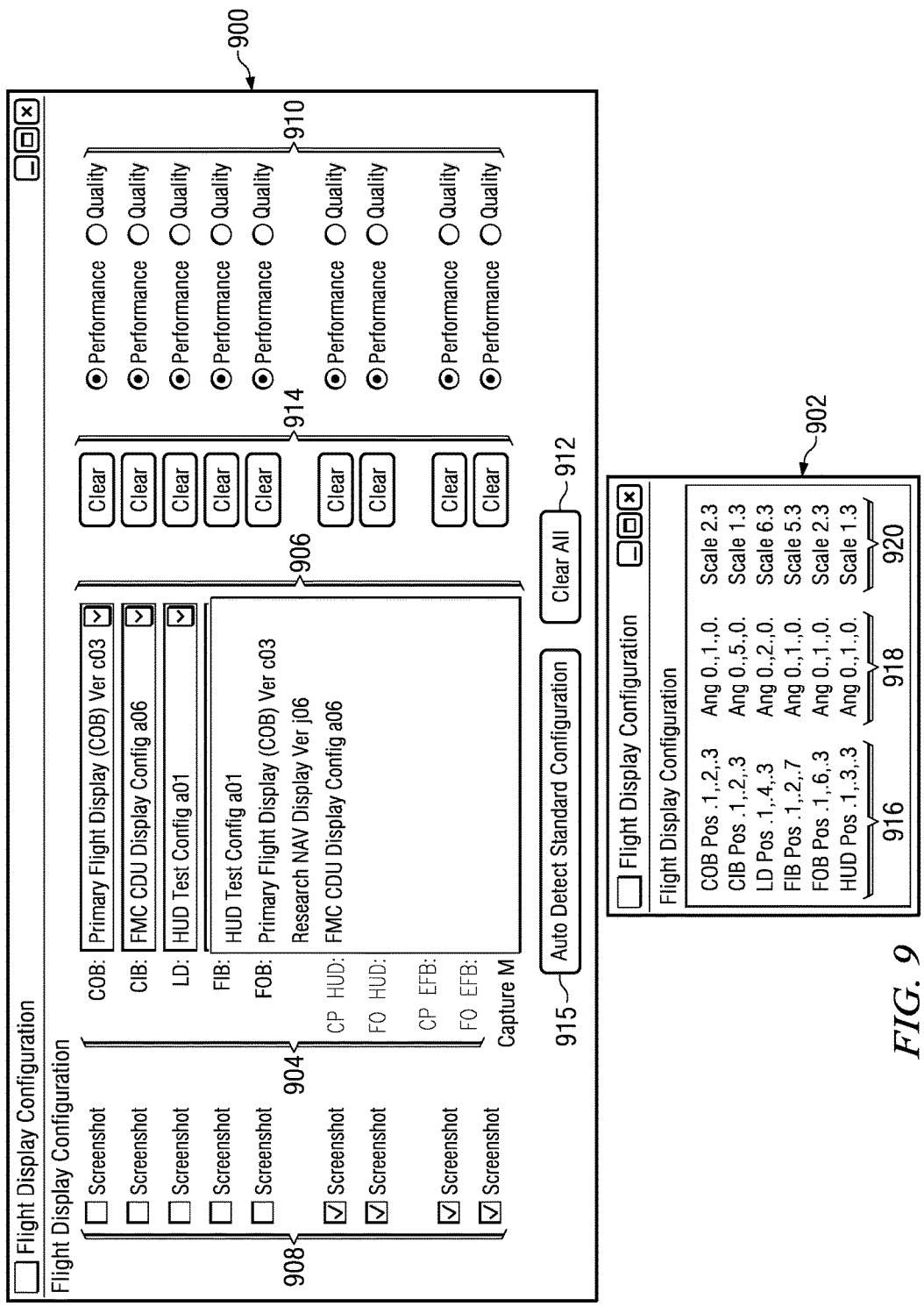
FIG. 9 is a diagram illustrating a user interface for assigning panels to locations in a flight deck in accordance with an advantageous embodiment.

With reference now to FIG. 9, a diagram illustrating a user interface for assigning panels to locations in a flight deck is depicted in accordance with an advantageous embodiment. In this example, user interface 900 is an example of a user interface that may be used to assign panels to locations within a virtual flight deck. Window 902 illustrates positions, orientations, and scales for different panels.

Within user interface 900, display positions 904 may indicate particular display positions as named by common flight deck conventions such as, for example, without limitation, Captain Outboard (COB), Captain Inboard (CIB), First Officer Inboard (FIB), First Officer Outboard (FOB), and Lower Control Display Unit (LD). These display positions are the potential locations at which different panels may be assigned.

Each drop-down menu within menus 906 provides a complete menu of all possible choices of pilot display programs for each particular display position. The user may select any of the pilot display programs available for a particular display position. For example, as seen in user interface 900 for the display position of First Officer Outboard (FOB), the user may select a pilot display program such as, for example, without limitation, HUD Test Config a01, Primary Flight Display (COB) Ver c03, Research NAV Display Ver j06, FMC CDU Display Config a06, or some other available pilot display program. In this manner, the user may select any of a number of combinations of pilot display programs for display positions.

Further, the user may select whether the display within a particular display position is displayed as a screenshot by selecting the "Screenshot" box from screenshot boxes 908 associated with the particular display position. Toggle buttons 910 allow the user to select whether the displays within the particular display positions are configured for performance or for quality.

Auto Detect Standard Configuration button 915 allows the user to select an auto detect standard configuration option that provides for automatic selection of a standard configuration for the display positions. This option gives the user the ability to assign panels to the display positions according to a standard use without having to manually select any of the configuration options presented in user interface 900.

Clear all button 912 allows the user to clear all configuration settings within user interface 900 so the user may start over, if necessary. In addition, clear buttons 914 allow the user to clear individual settings, such as the pilot display program selection, for a particular display position.

Window 902 allows the user to either type in position coordinates or read position coordinates from a file. Coordinates 916 indicate a three-dimensional position for the different display positions using (x, y, z) coordinates from the center of gravity of the aircraft. In this illustrative example, the display position Captain Outboard (COB) has position (0.1, 0.2, 0.3). Orientations 918 indicate the orientation for the different display positions by describing pitch, bank, and heading with reference to the nose of the aircraft. In this illustrative example, the orientation of the display position Captain Inboard (CIB) has a pitch of 0, a bank of 5, and a heading of 0 with reference to the nose of the aircraft.

Scale factors 920 indicate the scales for the different displays within the display positions. The display position First Officer Inboard (FIB) has a selected scale factor of 5.3. Thus, with user interface 900 and window 902, a user may assign panels to different locations within a virtual flight deck and may select the position, orientation, and scale of the display.

Figure 10:
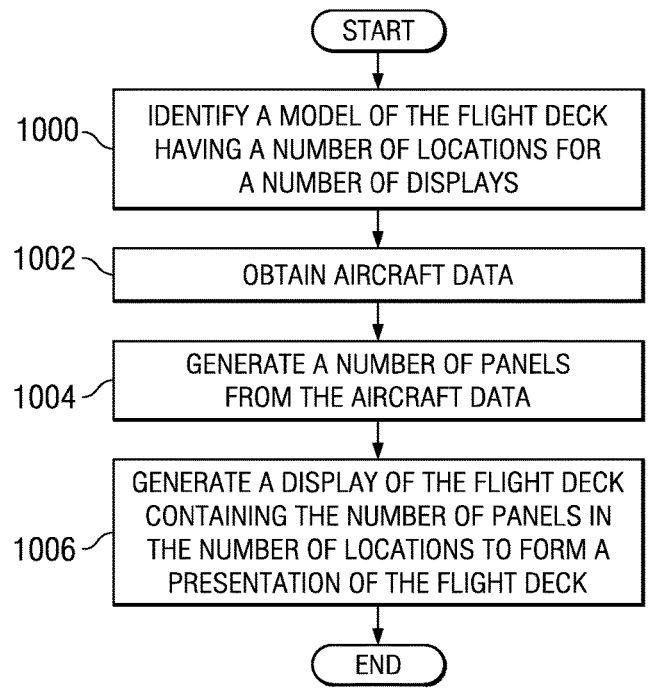
FIG. 10 is a flowchart of a process for presenting a virtual flight deck in accordance with an advantageous embodiment.

With reference now to FIG. 10, a flowchart of a process for presenting a virtual flight deck is depicted in accordance with an advantageous embodiment. The process illustrated in FIG. 10 may be implemented in a virtual flight deck environment such as virtual flight deck environment 300 in FIG. 3. In particular, this process may be implemented using display application 302 in FIG. 3.

The process begins by identifying a model of the flight deck having a number of locations for a number of displays (operation 1000). The process then obtains aircraft data (operation 1002). This aircraft data may be obtained from a number of different sources such as, for example, a flight simulation program, recorded flight data, real time flight data, and other suitable sources of aircraft data. The process then generates a number of panels using the aircraft data (operation 1004). The process then generates a display of the flight deck containing the number of panels in the number of locations to form a presentation of the flight deck (operation 1006), with the process terminating thereafter.

Figure 11:
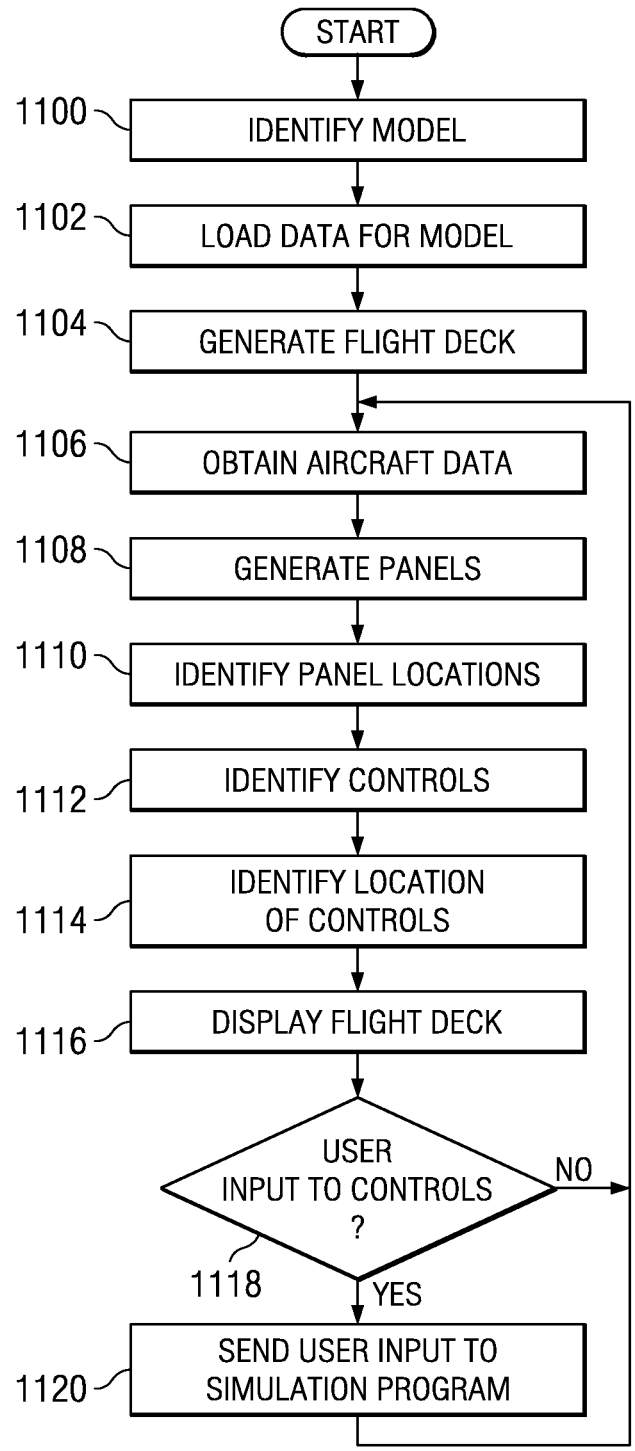
FIG. 11 is a flowchart of a process for generating a virtual flight deck in accordance with an advantageous embodiment.

With reference now to FIG. 11, a flowchart of a process for generating a virtual flight deck is depicted in accordance with an advantageous embodiment. The process illustrated in FIG. 11 may be implemented using a virtual flight deck environment, such as virtual flight deck environment 300 in FIG. 3. In particular, the process may be implemented in display application 302 in virtual flight deck environment 300 in FIG. 3.

The process begins by identifying a model for the virtual flight deck (operation 1100). The process then loads the data for the model (operation 1102). The model may include a number of different computer aided design files for the flight deck. The process then generates a flight deck from the data for the model (operation 1104). The process then obtains aircraft data (operation 1106).

Operation 1106 is used to insure that the aircraft is positioned correctly in three-dimensional space and that all of the different panels have realistic data. This data may include an identification of the altitude, airspeed, pitch, bank, heading, engine performance, latitude, longitude, and other suitable data. This data may be gathered from a source of aircraft data.

The process then generates panels from the obtained aircraft data (operation 1108). These panels include panels for the instruments in the flight deck as well as panels to display views outside of the windows of the flight deck. The process then identifies panel locations (operation 1110). The process then identifies controls for the flight deck (operation 1112).

These controls may be, for example, a control column, a joystick, a switch, and/or other controls that may be present in the flight deck. These controls are identified as controls that may be manipulated by user input during the presentation of the flight deck. In some cases, only a portion of the controls may be identified for this type of user input. The locations of the controls are then identified (operation 1114).

The process displays the flight deck with the panels and controls in the identified locations (operation 1116). The display of the flight deck may involve displaying the different components on the display device. The process then determines whether user input has been received to any of the identified controls (operation 1118). If user input is not received, the process returns to operation 1106 to receive additional aircraft data to generate new panels for the virtual flight deck. If user input is received, the process sends the user input to the simulation program (operation 1120), with the process then returning to operation 1106 as described above.

Thus, the different advantageous embodiments provide a computer implemented method, apparatus, and computer program code for presenting a flight deck. In one or more of the different advantageous embodiments, a model of the flight deck is identified in which the model has panels that are associated with or have locations within the flight deck. Aircraft data is also obtained. A display for each of the panels is generated from the aircraft data to form displays. The flight deck is generated to form a presentation of the flight deck. The displays are then placed into the locations for the presentation of the flight deck. The process then displays the presentation.

With these and other advantageous embodiments, different flight deck designs may be reviewed by changing the model. The simulation of the aircraft for which the flight deck is designed does not need to change. Only the model of the flight deck changes with the panels being displayed in the appropriate locations within the particular model. The panels may be manipulated to properly fit in the desired location in the new model.

With the capability to receive user input through controls, the virtual flight deck, in accordance with the different advantageous embodiments, may be used for training in addition to evaluation of the flight deck design. Also, with the dynamic presentation of data and the generation of the virtual flight deck from the model of the flight deck, customer evaluations may be made more realistic to potential customers. As a result, one or more of these and other suitable advantages may be achieved.

The different advantageous embodiments can take the form of an entirely hardware embodiment, an entirely software embodiment, or an embodiment containing both hardware and software elements. Some embodiments are implemented in software, which includes, but is not limited to, forms such as, for example, firmware, resident software, and microcode.

Furthermore, the different embodiments can take the form of a computer program product accessible from a computer-usable or computer-readable medium providing program code for use by, or in connection with, a computer or any device or system that executes instructions. For the purposes of this disclosure, a computer-usable or computer-readable medium can generally be any tangible apparatus that can contain, store, communicate, propagate, or transport the program for use by, or in connection with, the instruction execution system, apparatus, or device.

The computer-usable or computer-readable medium can be, for example, without limitation, an electronic, magnetic, optical, electromagnetic, infrared, or semiconductor system, or a propagation medium. Non-limiting examples of a computer-readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer-usable or computer-readable medium may contain or store a computer-readable or computer-usable program code such that when the computer-readable or computer-usable program code is executed on a computer, the execution of this computer-readable or computer-usable program code causes the computer to transmit another computer-readable or computer-usable program code over a communications link. This communications link may use a medium that is, for example, without limitation, physical or wireless.

A data processing system suitable for storing and/or executing computer-readable or computer-usable program code will include one or more processors coupled directly or indirectly to memory elements through a communications fabric, such as a system bus. The memory elements may include local memory employed during actual execution of the program code, bulk storage, and cache memories which provide temporary storage of at least some computer-readable or computer-usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples are modems and network adapters and are just a few of the currently available types of communications adapters.

The description of the different advantageous embodiments has been presented for purposes of illustration and description, and is not intended to be exhaustive or limited to the embodiments in the form disclosed. Many modifications and variations will be apparent to those of ordinary skill in the art.

Although the different embodiments are directed towards simulations of a flight deck for aircraft, other advantageous embodiments may be implemented for other vehicles or control areas. For example, the different advantageous embodiments may be applied to other platforms, such as a mobile platform, a stationary platform, a land-based structure, an aquatic-based structure, a space-based structure, and/or some other suitable object.

More specifically, the different advantageous embodiments may be applied to, for example, without limitation, generating simulations for control areas for a submarine, a bus, a personnel carrier, a tank, a train, an automobile, a spacecraft, a space station, a satellite, a surface ship, a power plant, a dam, a manufacturing facility, a building, and/or some other suitable object.

Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for evaluating a configuration of a flight deck design, the method comprising:
   a physical processor identifying a model of a flight deck, the model comprising: a computer aided design model of a structure of the flight deck, a display panel design, and a number of locations corresponding to a number of display panels on the structure of the flight deck; such that each display panel, in the number of display panels, corresponds to a location in the number of locations, the display panel design configured to receive inputs for changing a particular location corresponding to a particular display panel within the model of the flight deck, as well as an orientation and a scale of the particular display panel;
   receiving, from a user interface, a selection for: a display preference between performance and quality;
   evaluating the configuration before creating a prototype of and a simulator using the flight deck design the prototype comprising at least one of: wood, and core;
   identifying each location in the number of locations by a 3-D coordinate from a center of gravity of an aircraft comprising the flight deck;
   a panel, in the number of display panels, comprising a window display system and an instrument display system;
   the physical processor obtaining aircraft data comprising aircraft state data;
   the physical processor generating video data from the aircraft data;
   processing the video data and providing screen capture video data to display panels in the structure;
   the physical processor generating a display of the structure and the number of display panels of the flight deck responding to inputs from the aircraft data and an input device; and
   evaluating the configuration of the flight deck design via evaluating changes, responsive to inputs received from the input device, in the display of the structure and the number of display panels of the flight deck.

2. The method of claim 1 further comprising:
   displaying a number of controls within the flight deck communicating with an input device for controlling the number of controls;
   the physical processor generating new aircraft data responsive to receiving an input from the input device; and
   the physical processor modifying the number of display panels based on the new aircraft data.

3. The method of claim 2, wherein the step of generating the video data from the aircraft data comprises:
   the physical processor sending inputs received from the input device to a simulation program; and
   the physical processor receiving the new aircraft data from the simulation program.

4. A method for evaluating a configuration of a flight deck design, the method comprising:
   a physical processor identifying a model of a flight deck, the model comprising: a computer aided design model of a structure of the flight deck, a display panel design, and a number of locations corresponding to a number of display panels on the structure of the flight deck; such that each display panel, in the number of display panels, corresponds to a location in the number of locations, the display panel design configured to receive inputs for changing a particular location corresponding to a particular display panel within the model of the flight deck, as well as an orientation and a scale of the particular display panel;
   the physical processor obtaining aircraft data from at least one of: a simulation program, recorded flight data, and real time flight data, the aircraft data comprising aircraft state data;

the physical processor generating video data from the aircraft data;

processing the video data and providing screen capture video data to display panels in the structure;

the physical processor generating a display of the structure and the number of display panels of the flight deck responding to inputs from the aircraft data and an input device; and evaluating the configuration of the flight deck design via evaluating changes, responsive to inputs received from the input device, in the display of the structure and the number of display panels of the flight deck.

5. The method of claim 4, further comprising the physical processor identifying the model of the flight deck comprising: the flight deck design, the display panel design, a digital terrain, and the number of locations for the number of display panels.

6. A method for evaluating a configuration of a flight deck design, the method comprising:
a physical processor identifying a model of a flight deck, the model comprising: a computer aided design model of a structure of the flight deck, a display panel design, and a number of locations corresponding to a number of display panels on the structure of the flight deck; such that each display panel, in the number of display panels, corresponds to a location in the number of locations, the display panel design configured to receive inputs for changing a particular location corresponding to a particular display panel within the model of the flight deck, as well as an orientation and a scale of the particular display panel;

the physical processor obtaining aircraft data comprising aircraft state data;

the physical processor generating video data from the aircraft data;

processing the video data and providing screen capture video data to display panels in the structure;

the physical processor generating a display of the structure and the number of display panels of the flight deck responding to inputs from the aircraft data and an input device;

evaluating the configuration of the flight deck design via evaluating changes, responsive to inputs received from the input device, in the display of the structure and the number of display panels of the flight deck; and testing and reviewing alternative flight deck designs by changing the model of the flight deck.

7. A data processing system configured to evaluate, prior to a creation a prototype of and a simulator for a flight deck design, such that:
the flight deck design comprises a flight deck structure and a number of panels located on the flight deck structure;
the prototype comprises the at least one of: wood, and core;
at least one panel in the number of panels comprises a window display system and an instrument display system; and
the data processing system comprises:
a bus;
a communications unit connected to the bus;
a storage device connected to the bus, wherein the storage device includes program code; and
a processor unit connected to the bus, the processor unit configured to:

receive, from a user interface, a selection for: a display preference between performance and quality;

execute the program code to identify a model of a flight deck that comprises: a flight deck design, a display panel design, and a number of locations on the flight deck structure for assigning a number of panels for displays that comprise at least one of: instruments and controls, and display a number of controls within the flight deck configured to:
receive an input from an input device applied to the number of controls;
generate new aircraft data from the input; and
modify a number of the number of panels based on the new aircraft data;

execute the program code to send the input to a simulation program;

receive the new aircraft data from the simulation program;

receive an input, from an input device, to change a location of a panel, in the number of panels, in the model, the location being defined by a 3-D coordinate from a center of gravity of an aircraft that comprises the flight deck;

obtain aircraft data;

generate video data from the aircraft data;

process the video data to provide instrument displays for presentation within the panels for the flight deck; and generate a display of the flight deck that comprises the number of panels that forms a tool for an evaluation of the input to change to the location of the panel in the model of the flight deck.

8. A data processing system configured to evaluate, prior to a creation a prototype of and a simulator for a flight deck design, the flight deck design that comprises a flight deck structure and a number of panels located on the flight deck structure, such that the data processing system comprises:
a bus;
a communications unit connected to the bus;
a storage device connected to the bus, wherein the storage device includes program code; and
a processor unit connected to the bus, the processor unit configured to:
execute the program code to:
and identify a model of a flight deck that comprises: a flight deck design, a display panel design, and a number of locations on the flight deck structure for assigning a number of panels for displays that comprise at least one of: instruments and controls; and
test and to review the flight deck design responsive to a change of the model of the flight deck;
receive an input, from an input device, to change a location of a panel, in the number of panels, in the model, the location being defined by a 3-D coordinate from a center of gravity of an aircraft that comprises the flight deck;
obtain aircraft data;
generate video data from the aircraft data;
process the video data to provide instrument displays for presentation within the panels for the flight deck; and
generate a display of the flight deck that comprises the number of panels that forms a tool for an evaluation of the input to change to the location of the panel in the model of the flight deck.

9. The data processing system of claim 8, further comprising the processor unit configured to execute the program code to identify the model of the flight deck that comprises: the flight deck design, the display panel design, a digital terrain, and the number of locations for the number of panels.

10. A non-transitory computer recordable storage medium that comprises a computer program product programmed to:
  evaluate a configuration of a flight deck;
  identify a model of the flight deck that comprises: a flight deck design, a display panel design, and a number of locations, on a structure of the flight deck, that comprise a number of panels that comprise displays, each panel in the number of panels associated respectively with a location in the number of locations;
  receive an input, from an input device, to change a location in the number of location for a panel in the number of panels;
  obtain aircraft data that comprises aircraft state data;
  generate a video data from the aircraft data, and process the video data to provide instrument displays for presentation within the panels for the flight deck;
  generate a display of the flight deck that comprises the number of panels that forms a tool for an evaluation of the input to change to the location of the panel in the model of the flight deck; and
  test and review flight deck designs based upon a change of the model for the flight deck.

11. The non-transitory computer recordable storage medium of claim 10, further comprising:
  the evaluation being a prerequisite to a prototype or simulator for the flight deck; and
  the number of panels comprise at least one panel that comprises a window display system and an instrument display system.

12. The non-transitory computer recordable storage medium of claim 11 further comprising program code, stored on the non-transitory computer recordable storage medium, programmed to:
  receive, from a user interface, a selection for: a display preference between performance and quality;
  display a number of controls within the flight deck configured for manipulation via an input applied to the number of controls via an input device;
  generate new aircraft data from the input; and
  modify a number of the number of panels based on the new aircraft data.

13. The non-transitory computer recordable storage medium of claim 12, further comprising program code, stored on the non-transitory computer recordable storage medium, programmed to:
  send the input to a simulation program; and
  receive the new aircraft data from the simulation program.

14. The non-transitory computer recordable storage medium of claim 10, further comprising program code, stored on the non-transitory computer recordable storage medium, programmed to obtain the aircraft data from at least one of: a simulation program, recorded flight data, and real time flight data.

15. The computer program product of claim 10, further comprising:
  the location defined by a 3-D coordinate from a center of gravity of an aircraft that comprises the flight deck; and
  program code, stored on the non-transitory computer recordable storage medium, for identifying the model of the flight deck having the flight deck design, the display panel design, a digital terrain, and the number of locations for the number of panels.

* * * * *

UNITED STATES PATENT AND TRADEMARK OFFICE
CERTIFICATE OF CORRECTION

PATENT NO. : 9,836,991 B2
APPLICATION NO. : 12/249359
DATED : December 5, 2017
INVENTOR(S) : Whittington et al.

Page 1 of 1

It is certified that error appears in the above-identified patent and that said Letters Patent is hereby corrected as shown below:

In the Claims

Column 16, Line 13, change "the flight deck design" to read --the flight deck design,--
Column 17, Line 51, change "a creation a prototype" to --a creation of a prototype--
Column 17, Line 56, change "the at least one of" to --at least one of--
Column 18, Line 35, change "a creation a prototype" to --a creation of a prototype--
Column 19, Line 17, change "the number of location" to --the number of locations--

Signed and Sealed this
Twenty-seventh Day of November, 2018

Andrei Iancu
*Director of the United States Patent and Trademark Office*